(12) United States Patent
Wang

(10) Patent No.: US 11,176,980 B2
(45) Date of Patent: Nov. 16, 2021

(54) MAGNETIC MEMORY AND FORMATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Tao Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/806,245

(22) Filed: Mar. 2, 2020

(65) Prior Publication Data

US 2020/0294568 A1    Sep. 17, 2020

(30) Foreign Application Priority Data

Mar. 12, 2019  (CN) .......................... 201910184457.5

(51) Int. Cl.
*G11C 11/16*    (2006.01)

(52) U.S. Cl.
CPC ........ *G11C 11/161* (2013.01); *G11C 11/1659* (2013.01); *G11C 11/1673* (2013.01); *G11C 11/1675* (2013.01)

(58) Field of Classification Search
CPC .................................................. G11C 11/1659
USPC .......................................................... 365/158
See application file for complete search history.

(56) References Cited

U.S. PATENT DOCUMENTS

| 2013/0308374 | A1* | 11/2013 | Gogl | .................... | G11C 11/1673 |
| | | | | | 365/158 |
| 2016/0254318 | A1* | 9/2016 | Lu | .......................... | G11C 11/161 |
| | | | | | 257/421 |
| 2018/0190899 | A1* | 7/2018 | Kim | ........................ | H01L 43/08 |
| 2020/0395068 | A1* | 12/2020 | Sekar | .................... | G11C 13/003 |

* cited by examiner

*Primary Examiner* — Min Huang
(74) *Attorney, Agent, or Firm* — Anova Law Group, PLLC

(57) ABSTRACT

A magnetic memory device is provided. The magnetic memory device includes a bit line, a first word line, a source line, and a memory cell. The memory cell includes a first switch transistor and a magnetic tunnel junction. A first side of the magnetic tunnel junction is connected to a first terminal of the first switch transistor. The bit line is connected to a second terminal of the first switch transistor. The source line is connected to a second side of the magnetic tunnel junction. The first word line is connected to a third terminal of the first switch transistor.

18 Claims, 4 Drawing Sheets

MAGNETIC MEMORY AND FORMATION METHOD THEREOF

CROSS-REFERENCE TO RELATED APPLICATIONS

This application claims the priority of Chinese Patent Application No. CN 201910184457.5, filed on Mar. 12, 2019, the entire content of which is incorporated herein by reference.

FIELD OF THE DISCLOSURE

The present disclosure generally relates to the field of data storage and, more particularly, relates to a magnetic memory and formation method.

BACKGROUND

A magnetic memory is a device for storing data. A method of writing data to the magnetic memory is to perform a write operation by generating a magnetic field around a magnetic tunnel junction in a memory cell.

The magnetic memory includes a plurality of memory cells. When a read operation or a write operation is performed on the magnetic memory, the operation is not generally performed on all the memory cells in the magnetic memory at the same time. Because a high voltage is applied to a bit line when the operation is performed on the magnetic memory, a leakage current flows through magnetic tunnel junctions of a part of memory cells that are not selected to perform the operation, thereby generating crosstalk and decreasing reliability of the magnetic memory. The disclosed magnetic memory structures are directed to solve one or more problems set forth above and other problems in the art.

BRIEF SUMMARY OF THE DISCLOSURE

One aspect of the present disclosure provides a magnetic memory device. The magnetic memory device includes a bit line, a first word line, a source line, and a memory cell. The memory cell includes a first switch transistor and a magnetic tunnel junction. A first side of the magnetic tunnel junction is connected to a first terminal of the first switch transistor. The bit line is connected to a second terminal of the first switch transistor. The source line is connected to a second side of the magnetic tunnel junction. The first word line is connected to a third terminal of the first switch transistor.

Another aspect of the present disclosure provides a method for forming a magnetic memory device. A memory cell is provided including a first switch transistor and a magnetic tunnel junction. A first side of the magnetic tunnel junction is connected to a first terminal of the first switch transistor. The bit line is connected to a second terminal of the first switch transistor. The source line is connected to a second side of the magnetic tunnel junction. The first word line is connected to a third terminal of the first switch transistor.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

The magnetic memory includes a plurality of memory cells. When a read operation or a write operation is performed on the magnetic memory, the operation is not generally performed on all the memory cells in the magnetic memory at the same time. Because a high voltage is applied to a bit line when the operation is performed on the magnetic memory, a leakage current flows through magnetic tunnel junctions of a part of memory cells that are not selected to perform the operation, thereby generating crosstalk and decreasing reliability of the magnetic memory.

In one embodiment, by a first switch transistor provided between a bit line and the magnetic tunnel junction, a first word line is connected to a third terminal of the first switch transistor for controlling whether the first switch transistor is turn on or off. When the read operation or the write operation is performed on the memory cell, a potential difference is formed between the bit line and a source line. The first word line applies a voltage to the third terminal of the first switch transistor, and the first terminal of the first switch transistor is electrically connected to the second terminal of the first switch transistor. When the read operation or the write operation is not performed on the memory cell, the potential difference is formed between the bit line and the source line. The first word line does not apply a voltage to the third terminal of the first switch transistor, and the first terminal of the first switch transistor is disconnected from the second terminal of the first switch transistor. The disclosed magnetic memory structure avoids the leakage current flowing through the magnetic tunnel junctions of the memory cells that are not selected to perform the operation, thereby avoiding generating crosstalk and improving reliability of the magnetic memory.

Further features of the present disclosure and advantages thereof will become apparent from the following detailed description of exemplary embodiments according to the present disclosure with reference to the accompanying drawings.

Figure 1:
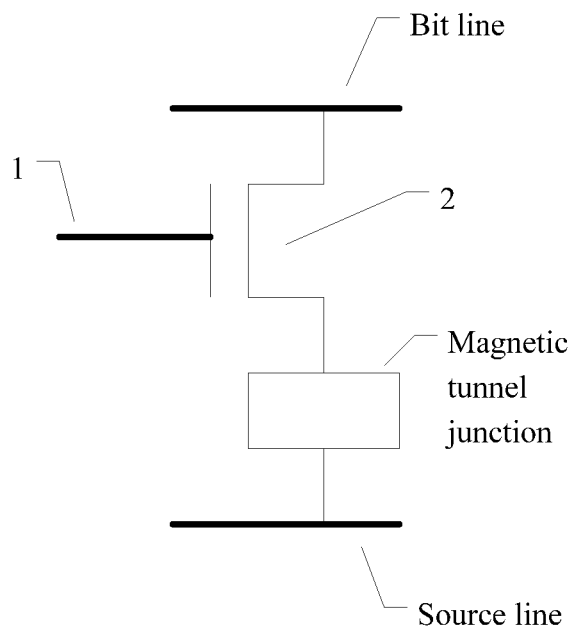
FIG. 1 illustrates a schematic view of a magnetic memory structure consistent with various embodiments of the present disclosure.

FIG. 1 illustrates a schematic view of a magnetic memory structure consistent with the disclosed embodiments. Referring to FIG. 1, the magnetic memory may include a bit line, a first word line 1, a source line, and a memory cell.

The memory cell may include a first switch transistor 2 and a magnetic tunnel junction, where a first side of the magnetic tunnel junction is connected to a first terminal of the first switch transistor 2.

The bit line is connected to a second terminal of the first switch transistor 2.

The source line is connected to a second side of the magnetic tunnel junction.

The first word line 1 is connected to a third terminal of the first switch transistor 2.

In one embodiment of the present disclosure, when a read operation or a write operation is performed on the memory cell, a first potential difference is formed between the bit line and the source line. The first word line 1 applies a voltage to the third terminal of the first switch transistor 2, and the first terminal of the first switch transistor 2 is electrically connected to the second terminal of the first switch transistor 2.

In one embodiment of the present disclosure, when the read operation or the write operation is not performed on the memory cell, a second potential difference is formed between the bit line and the source line. The first word line 1 does not apply the voltage to the third terminal of the first switch transistor 2, and the first terminal of the first switch transistor 2 is disconnected from the second terminal of the first switch transistor 2.

In a specific embodiment, the bit line and the source line are common lines, and each bit line or source line is connected to a part of the memory cells in the magnetic memory. When the read operation or the write operation is performed on the magnetic memory, a high voltage is generally applied to the bit line. That is, the voltage applied to the bit line is higher than the voltage applied to the source line. In current technology, a basic structure of a memory cell in a magnetic memory includes the following. A magnetic tunnel junction is directly connected to a bit line. The magnetic tunnel junction is connected to a first switch transistor. The first switch transistor is connected to a source line and a first word line, respectively. When a certain memory cell is not selected to perform the read operation or the write operation, the first word line does not apply a voltage to the first switch transistor, thereby disconnecting the bit line from the source line, and expecting no current flowing through the magnetic tunnel junction. However, since the bit line acts as the common line, the high voltage applied to the bit line still affects some memory cells that are not selected to perform the read operation or the write operation. Similarly, since the source line also acts as the common line, the high voltage applied to the source line still affects some memory cells that are not selected to perform the read operation or the write operation. In addition, since the bit line and the magnetic tunnel junction are directly connected, there is still possibility that the leakage current starts from the bit line and flows through the magnetic tunnel junction, which causes crosstalk on the magnetic tunnel junction, and ultimately affects the reliability of the memory cell.

In one embodiment of the present disclosure, the magnetic tunnel junction is not directly connected to the bit line, whereas the first switch transistor 2 is disposed between the magnetic tunnel junction and the bit line. When the memory cell is selected to perform the operation, the first word line 1 which is connected to the first switch transistor 2 applies the voltage to the third terminal of the first switch transistor 2. The first switch transistor 2 is turned on. A current flows from the bit line through the first switch transistor 2 and the magnetic tunnel junction to the source line, achieving a purpose of performing the operation on the magnetic memory. When the memory cell is not selected to perform the operation, the first word line 1 which is connected to the first switch transistor 2 does not apply the voltage to the third terminal of the first switch transistor 2, and the first switch transistor 2 is turned off. Since the first switch transistor 2 is disposed between the bit line and the magnetic tunnel junction, when the first switch transistor 2 is turned off, even if the high voltage is still applied to the bit line, there is no leakage current flowing through the magnetic tunnel junction, which can avoid generating the crosstalk. At the same time, it is not necessary to reduce the voltage on the bit line to avoid generating the leakage current, thereby improving work performance and reliability of the magnetic memory.

In a specific embodiment, the first switch transistor 2 is a device for controlling whether the circuit is turned on or off. When the first word line 1 applies the voltage to the third terminal of the first switch transistor 2, and the voltage value applied to the third terminal of the first switch transistor 2 and the voltage value applied to the bit line meet certain requirement, the first switch transistor 2 is turned on.

In one embodiment of the present disclosure, the first switch transistor 2 may be a metal-oxide-semiconductor (MOS) transistor. A drain electrode of the MOS transistor is connected to the bit line. A source electrode of the MOS transistor is connected to the first side of the magnetic tunnel junction. A gate electrode of the MOS transistor is connected to the first word line 1.

In a specific embodiment, the source electrode of the MOS transistor is the first terminal of the first switch transistor 2. The drain electrode of the MOS transistor is the second terminal of first switch transistor 2. The gate electrode of the MOS transistor is the third terminal of the first switch transistor 2.

In a specific embodiment, the first switch transistor 2 may be a MOS transistor. When the read operation or the write operation is performed on the selected memory cell, the bit line applies a high voltage to the drain electrode of the MOS transistor. The first word line 1 applies the voltage to the gate electrode of the MOS transistor. When meeting turn-on conditions of the MOS transistor applied by the memory cell, the MOS transistor is turned on; when the memory cell is not selected to perform the operation, although the bit line still applies the high voltage to the drain electrode of the MOS transistor, the first word line 1 does not apply the voltage to the gate electrode of the MOS transistor, and the MOS transistor is turned off. At the same time, since the first switch transistor 2 is disposed between the magnetic tunnel junction and the bit line, there is no leakage current from the bit line flowing through the magnetic tunnel junction.

Figure 2:
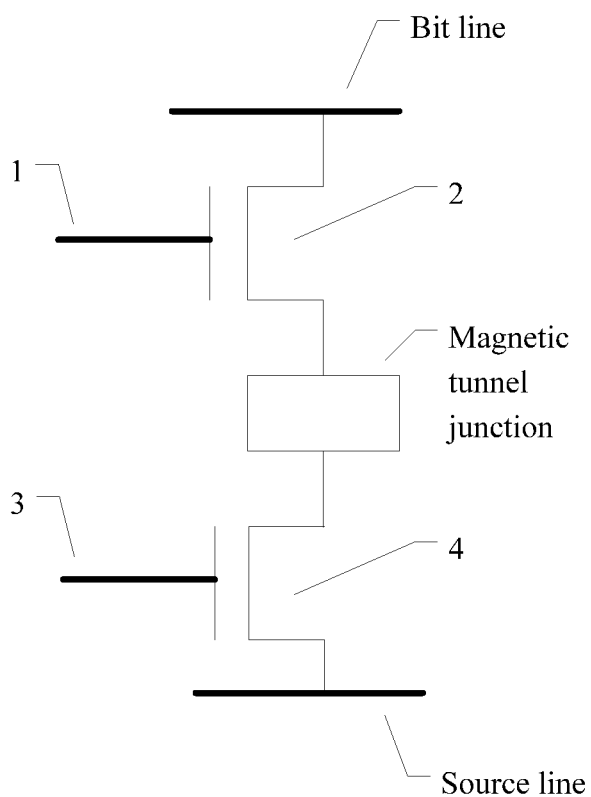
FIG. 2 illustrates a schematic view of another magnetic memory structure consistent with various embodiments of the present disclosure.

FIG. 2 is a schematic diagram of another magnetic memory structure consistent with various embodiments of the present disclosure.

Referring to FIG. 2, the magnetic memory may further include a second switch transistor 4 and a second word line 3, where a first terminal of the second switch transistor 4 is connected to a source line; a second terminal of the second switch transistor 4 is connected to a second side of the magnetic tunnel junction; and a third terminal of the second switch transistor 4 is connected to the second word line 3.

In one embodiment of the present disclosure, when a read operation or a write operation is performed on a memory cell, the first word line 1 applies a voltage to the third terminal of the first switch transistor 2. The second word line 3 applies a voltage to the third terminal of the second switch transistor 4. The first terminal and the second terminal of the first switch transistor 2 are electrically connected, and the first terminal and the second terminal of the second switch transistor 4 are electrically connected.

In one embodiment of the present disclosure, when the read operation or the write operation is not performed on the memory cell, if the voltage on the bit line is higher than the voltage on the source line, the first word line 1 does not apply a voltage to the third terminal of the first switch transistor 2, and the second word line 3 applies a voltage to the third terminal of the second switch transistor 4. The first terminal and the second terminal of the first switch transistor 2 are disconnected, and the first terminal and the second terminal of the second switch transistor 4 are electrically connected.

In one embodiment of the present disclosure, when the read operation or the write operation is not performed on the memory cell, if the voltage on the bit line is lower than the voltage on the source line, the first word line 1 applies a voltage to the third terminal of the first switch transistor 2, and the second word line 3 does not apply a voltage to the third terminal of the second switch transistor 4. The first terminal and the second terminal of the first switch transistor 2 are electrically connected, and the first terminal and the second terminal of the second switch transistor 4 are disconnected.

In a specific embodiment, when a part of the magnetic memory performs a write operation, according to different content written to the memory cell, a high voltage may be applied to the source line, that is, the voltage applied on the source line is higher than the voltage applied on the bit line. In the above case, in order to avoid generating a leakage current flowing through the magnetic tunnel junction from the source line due to the high voltage applied to the source line, the second switch transistor 4 is disposed between the source line and the magnetic tunnel junction.

In a specific embodiment, when the memory cell is selected to perform a write operation or a read operation, the source line is applied with a high voltage or a bit line is applied with a high voltage, and the first word line 1 applies the voltage to the first switch transistor 2, and the second word line 3 applies the voltage to the second switch transistor 4. The first switch transistor 2 is turned on, and the second switch transistor 4 is turned on. The current starts from the source line or the bit line and flows through the magnetic tunnel junction to perform the write operation.

In a specific embodiment, when the memory cell is not selected to perform the write operation, in the case where the bit line is applied with a high voltage, the first word line 1 does not apply the voltage to the first switch transistor 2, and the second word line 3 applies the voltage to the second switch transistor 4. The first switch transistor 2 is turned off, and the second switch transistor 4 is turned on. Thus, there is no leakage current flowing through the magnetic tunnel junction from the bit line, thereby avoiding generating the crosstalk. The magnetic tunnel junction is connected to the source line, avoiding generating floating.

In a specific embodiment, when the memory cell is not selected to perform the write operation, in the case where the source line is applied with the high voltage, the first word line 1 applies the voltage to the first switch transistor 2, and the second word line 3 does not apply the voltage to the second switch transistor 4. The first switch transistor 2 is turned on, and the second switch transistor 4 is turned off. There is no leakage current flowing through the magnetic tunnel junction from the source line, thereby avoiding generating the crosstalk. The magnetic tunnel junction is connected to the bit line, avoiding generating floating.

In a specific embodiment, when the memory cell is not selected to perform the read operation, in the case where the bit line is applied with the high voltage, the first word line 1 does not apply the voltage to the first switch transistor 2, and the second word line 3 applies the voltage to the second switch transistor 4. The first switch transistor 2 is turned off, and the second switch transistor 4 is turned on. There is no leakage current flowing through the magnetic tunnel junction from the bit line, thereby avoiding generating the crosstalk. The magnetic tunnel junction is connected to the source line, avoiding generating floating.

In one embodiment of the present disclosure, the second switch transistor 4 is a MOS transistor. The drain electrode of the MOS transistor is connected to the second side of the magnetic tunnel junction. The source electrode of the MOS transistor is connected to the source line. The gate electrode of the MOS transistor is connected to the second word line 3.

In a specific embodiment, the source electrode of the MOS transistor is the first terminal of the second switch transistor 4. The drain electrode of the MOS transistor is the second terminal of the second switch transistor 4. The gate electrode of the MOS transistor is the third terminal of the second switch transistor 4.

Figure 3:
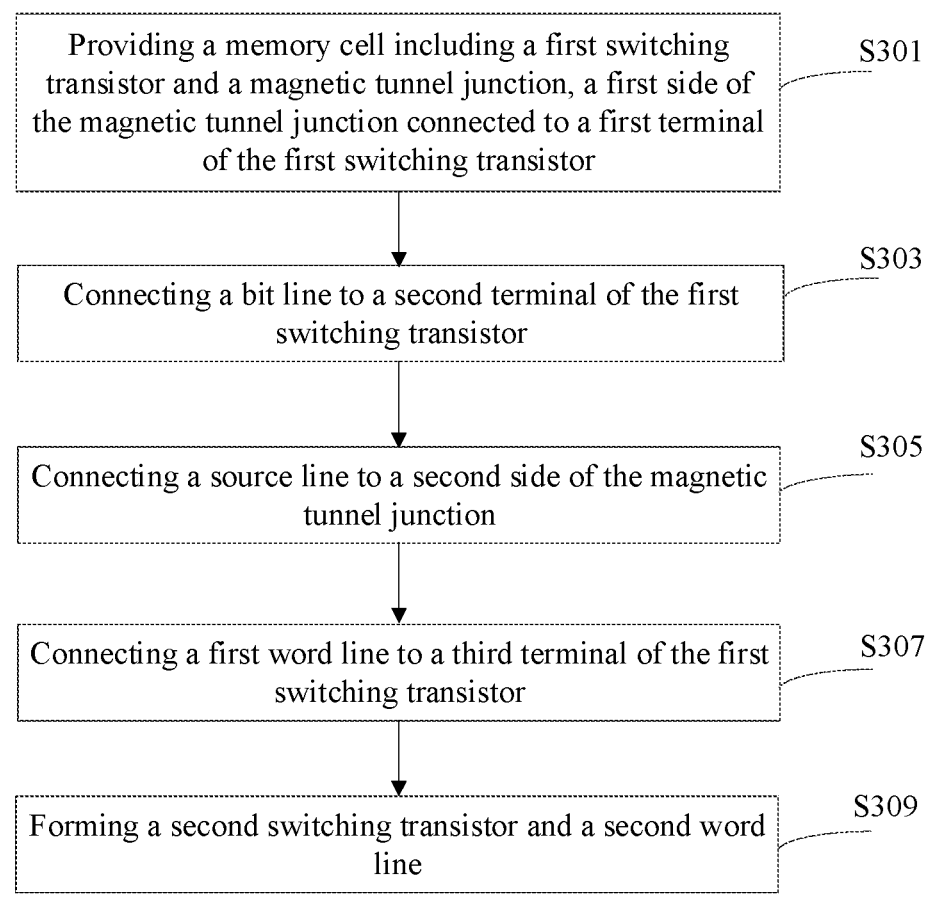
FIG. 3 illustrates a flowchart of an exemplary method for forming a magnetic memory consistent with various embodiments of the present disclosure.

The present disclosure provides a method for forming a magnetic memory device. FIG. 3 illustrates a flowchart of an exemplary method for forming a magnetic memory device consistent with various embodiments of the present disclosure. Referring to FIG. 3, the method may include the following exemplary steps.

S301: Forming a memory cell, comprising a first switch transistor and a magnetic tunnel junction, where a first side of the magnetic tunnel junction is connected to a first terminal of the first switch transistor.

S303: Connecting a bit line to a second terminal of the first switch transistor.

S305: Connecting a source line to a second side of the magnetic tunnel junction.

S307: Connecting a first word line to a third terminal of the first switch transistor.

Figure 4:
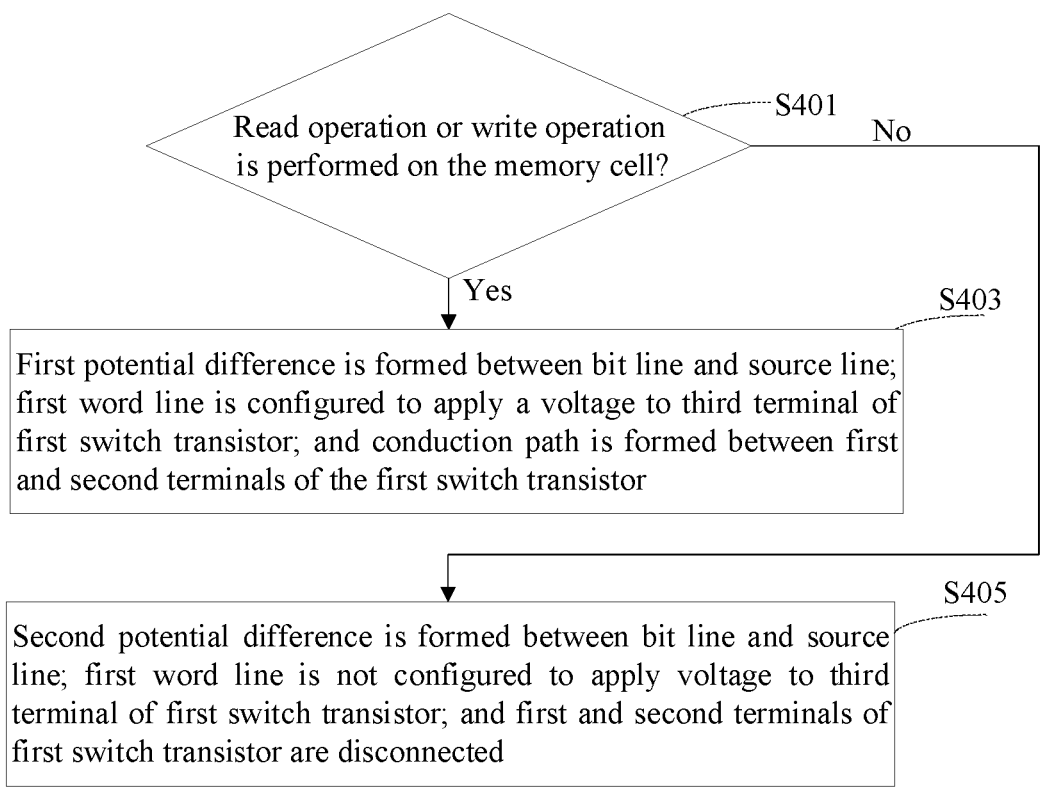
FIG. 4 illustrates a flowchart of an exemplary process for performing a read operation or a write operation on the memory cell consistent with various embodiments of the present disclosure.

In one embodiment of the present disclosure, referring to FIG. 4, at the beginning, whether a read operation or a write operation is performed on the memory cell is determined (S401). When the read operation or the write operation is performed on the memory cell, S403 is performed. That is, a first potential difference is formed between the bit line and the source line; the first word line applies a voltage to the third terminal of the first switch transistor; and the first terminal of the first switch transistor is electrically connected to the second terminal of the first switch transistor.

In one embodiment of the present disclosure, when the read operation or the write operation is not performed on the memory cell, S405 is performed. That is, a second potential difference is formed between the bit line and the source line; the first word line does not apply the voltage to the third terminal of the first switch transistor; and the first terminal of the first switch transistor is disconnected from the second terminal of the first switch transistor.

Further, a first switch transistor is a metal-oxide-semiconductor (MOS) transistor, where a drain electrode of the MOS transistor is connected to the bit line; a source electrode of the MOS transistor is connected to the first side of the magnetic tunnel junction; and a gate electrode of the MOS transistor is connected to the first word line.

Further, returning to FIG. 3, Optionally, the method may include forming a second switch transistor and a second word line (S309), where a first terminal of the second switch transistor is connected to the source line; a second terminal of the second switch transistor is connected to a second side of the magnetic tunnel junction; and a third terminal of the second switch transistor is connected to the second word line.

Figure 5:
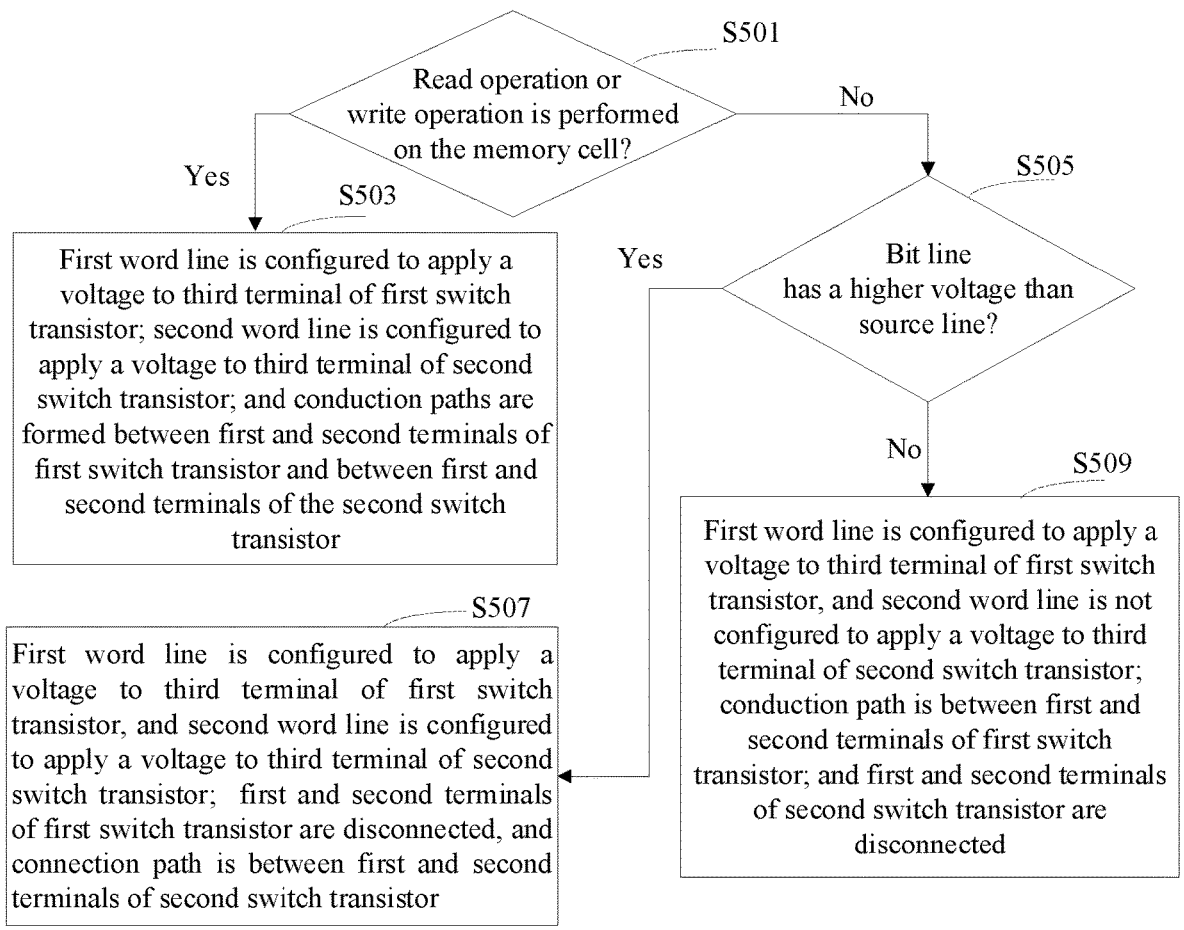
FIG. 5 illustrates a flowchart of another exemplary process for performing a read operation or a write operation on the memory cell consistent with various embodiments of the present disclosure.

Referring to FIG. 5, In one embodiment of the present disclosure, at the beginning, whether a read operation or a write operation is performed on the memory cell is determined (S501). When the read operation or the write operation is performed on the memory cell, S503 is performed. That is, the first word line applies the voltage to the third terminal of the first switch transistor; the second word line applies the voltage to the third terminal of the second switch transistor; the first terminal and the second terminal of the first switch transistor are electrically connected; and the first terminal and the second terminal of the second switch transistor are electrically connected.

In one embodiment of the present disclosure, when the read operation or the write operation is not performed on the memory cell, a voltage on the bit line is compared with a voltage on the source line. That is, whether the voltage on the bit line is higher than the voltage on the source line is determined (S505). If the voltage on the bit line is higher than the voltage on the source line, S507 is performed. That is, the first word line does not apply the voltage to the third terminal of the first switch transistor; the second word line applies the voltage to the third terminal of the second switch transistor; the first terminal and the second terminal of the first switch transistor are disconnected; and the first terminal and the second terminal of the second switch transistor are electrically connected.

In one embodiment of the present disclosure, when the read operation or the write operation is not performed on the memory cell, if the voltage on the bit line is lower than the voltage on the source line, S509 is performed. That is, the first word line applies a voltage to the third terminal of the first switch transistor; the second word line does not apply a voltage to the third terminal of the second switch transistor; the first terminal and the second terminal of the first switch transistor are electrically connected; and the first terminal and the second terminal of the second switch transistor are disconnected.

The second switch transistor is a MOS transistor, where the drain electrode of the MOS transistor is connected to the second side of the magnetic tunnel junction; the source electrode of the MOS transistor is connected to the source line; and the gate electrode of the MOS transistor is connected to the second word line.

Compared to existing magnetic memory, the disclosed magnetic memory device may demonstrate the following exemplary advantages. The magnetic memory device includes a bit line, a first word line, a source line, and a memory cell. The memory cell includes a first switch transistor and a magnetic tunnel junction, where a first side of the magnetic tunnel junction is connected to a first terminal of the first switch transistor. The bit line is connected to a second terminal of the first switch transistor. The source line is connected to a second side of the magnetic tunnel junction. The first word line is connected to a third terminal of the first switch transistor. The disclosed magnetic memory structure avoids a leakage current flowing through the magnetic tunnel junctions of the memory cells that are not selected to perform the operation, thereby avoiding generating crosstalk and improving reliability of the magnetic memory.

The above detailed descriptions only illustrate certain exemplary embodiments of the present invention and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A magnetic memory device, comprising:
    a memory cell, comprising:
        a first switch transistor, and
        a magnetic tunnel junction, wherein a first side of the magnetic tunnel junction is connected to a first terminal of the first switch transistor;
    a bit line, connecting to a second terminal of the first switch transistor;
    a source line, connecting to a second side of the magnetic tunnel junction;
    a first word line, connecting to a third terminal of the first switch transistor; and
    a second switch transistor and a second word line, wherein:
        a first terminal of the second switch transistor is connected to the source line;
        a second terminal of the second switch transistor is connected to the second side of the magnetic tunnel junction;
        a third terminal of the second switch transistor is connected to the second word line; and
        when none of a read operation and a write operation is performed on the memory cell and when a voltage on the bit line is lower than the voltage on the source line:
            the first word line is configured to apply the voltage to the third terminal of the first switch transistor;
            the second word line is not configured to apply the voltage to the third terminal of the second switch transistor;
            a connection path is formed between the first terminal and the second terminal of the first switch transistor; and
            the first terminal and the second terminal of the second switch transistor are disconnected.

2. The device according to claim 1, wherein when one of a read operation and a write operation is performed on the memory cell:
    a first potential difference is formed between the bit line and the source line;
    the first word line is configured to apply a voltage to the third terminal of the first switch transistor; and
    the first terminal of the first switch transistor is connected electrically to the second terminal of the first switch transistor.

3. The device according to claim 1, wherein, when none of a read operation and a write operation is performed on the memory cell:
    a second potential difference is formed between the bit line and the source line;
    the first word line is not configured to apply the voltage to the third terminal of the first switch transistor; and
    the first terminal of the first switch transistor is disconnected from the second terminal of the first switch transistor.

4. The device according to claim 1, wherein:
    the first switch transistor is a metaloxidesemiconductor (MOS) transistor, wherein:

a drain electrode of the MOS transistor is connected to the bit line;
a source electrode of the MOS transistor is connected to the first side of the magnetic tunnel junction; and
a gate electrode of the MOS transistor is connected to the first word line.

5. The device according to claim 1, wherein when one of a read operation and a write operation is performed on the memory cell:
the first word line is configured to apply a voltage to the third terminal of the first switch transistor;
the second word line is configured to apply the voltage to the third terminal of the second switch transistor;
a connection path is formed between the first terminal and the second terminal of the first switch transistor; and
a connection path is formed between the first terminal and the second terminal of the second switch transistor.

6. A magnetic memory device, comprising:
a memory cell, comprising:
a first switch transistor, and
a magnetic tunnel junction, wherein a first side of the magnetic tunnel junction is connected to a first terminal of the first switch transistor;
a bit line, connecting to a second terminal of the first switch transistor;
a source line, connecting to a second side of the magnetic tunnel junction;
a first word line, connecting to a third terminal of the first switch transistor; and
a second switch transistor and a second word line, wherein:
a first terminal of the second switch transistor is connected to the source line;
a second terminal of the second switch transistor is connected to the second side of the magnetic tunnel junction;
a third terminal of the second switch transistor is connected to the second word line; and
when none of a read operation and a write operation is performed on the memory cell and when a voltage on the bit line is higher than a voltage on the source line:
the first word line is not configured to apply a voltage to the third terminal of the first switch transistor;
the second word line is configured to apply a voltage to the third terminal of the second switch transistor;
the first terminal and the second terminal of the first switch transistor are disconnected; and
the first terminal and the second terminal of the second switch transistor are electrically connected.

7. The device according to claim 1, wherein:
the second switch transistor is a MOS transistor, wherein:
a drain electrode of the MOS transistor is connected to the second side of the magnetic tunnel junction;
a source electrode of the MOS transistor is connected to the source line; and
a gate electrode of the MOS transistor is connected to the second word line.

8. A method for forming a magnetic memory device, comprising:
providing a memory cell, comprising a first switch transistor and a magnetic tunnel junction, wherein a first side of the magnetic tunnel junction is connected to a first terminal of the first switch transistor;
connecting a bit line to a second terminal of the first switch transistor;

connecting a source line to a second side of the magnetic tunnel junction after the bit line is connected to the second terminal of the first switch transistor;
connecting a first word line to a third terminal of the first switch transistor; and
providing a second switch transistor and a second word line, wherein:
a first terminal of the second switch transistor is connected to the source line;
a second terminal of the second switch transistor is connected to a second side of the magnetic tunnel junction; and
a third terminal of the second switch transistor is connected to the second word line,
wherein when none of a read operation and a write operation is performed on the memory cell and when a voltage on the bit line is higher than a voltage on the source line:
the first word line is not configured to apply a voltage to the third terminal of the first switch transistor;
the second word line is configured to apply a voltage to the third terminal of the second switch transistor;
the first terminal and the second terminal of the first switch transistor are disconnected; and
the first terminal and the second terminal of the second switch transistor are electrically connected.

9. The method according to claim 8, wherein:
the first switch transistor is a metal-oxide-semiconductor (MOS) transistor, wherein:
a drain electrode of the MOS transistor is connected to the bit line;
a source electrode of the MOS transistor is connected to the first side of the magnetic tunnel junction; and
a gate electrode of the MOS transistor is connected to the first word line.

10. The method according to claim 8, wherein:
the second switch transistor is a MOS transistor, wherein:
a drain electrode of the MOS transistor is connected to the second side of the magnetic tunnel junction;
a source electrode of the MOS transistor is connected to the source line; and
a gate electrode of the MOS transistor is connected to the second word line.

11. The method according to claim 8, wherein when one of a read operation and a write operation is performed on the memory cell:
a first potential difference is formed between the bit line and the source line;
the first word line is configured to apply a voltage to the third terminal of the first switch transistor; and
the first terminal of the first switch transistor is connected electrically to the second terminal of the first switch transistor.

12. The method according to claim 8, wherein, when none of a read operation and a write operation is performed on the memory cell:
a second potential difference is formed between the bit line and the source line;
the first word line is not configured to apply the voltage to the third terminal of the first switch transistor; and
the first terminal of the first switch transistor is disconnected from the second terminal of the first switch transistor.

13. The method according to claim 8, wherein when one of a read operation and a write operation is performed on the memory cell:

the first word line is configured to apply a voltage to the third terminal of the first switch transistor;

the second word line is configured to apply the voltage to the third terminal of the second switch transistor;

a connection path is formed between the first terminal and the second terminal of the first switch transistor; and a connection path is formed between the first terminal and the second terminal of the second switch transistor.

14. The method according to claim 8, wherein when none of a read operation and a write operation is performed on the memory cell and when a voltage on the bit line is lower than the voltage on the source line:

the first word line is configured to apply the voltage to the third terminal of the first switch transistor;

the second word line is not configured to apply the voltage to the third terminal of the second switch transistor;

a connection path is formed between the first terminal and the second terminal of the first switch transistor; and the first terminal and the second terminal of the second switch transistor are disconnected.

15. The device according to claim 6, wherein when one of a read operation and a write operation is performed on the memory cell:

a first potential difference is formed between the bit line and the source line;

the first word line is configured to apply a voltage to the third terminal of the first switch transistor; and the first terminal of the first switch transistor is connected electrically to the second terminal of the first switch transistor.

16. The device according to claim 6, wherein, when none of a read operation and a write operation is performed on the memory cell:

a second potential difference is formed between the bit line and the source line;

the first word line is not configured to apply the voltage to the third terminal of the first switch transistor; and the first terminal of the first switch transistor is disconnected from the second terminal of the first switch transistor.

17. The device according to claim 6, wherein:

the first switch transistor is a metal-oxide-semiconductor (MOS) transistor, wherein:

a drain electrode of the MOS transistor is connected to the bit line;

a source electrode of the MOS transistor is connected to the first side of the magnetic tunnel junction; and a gate electrode of the MOS transistor is connected to the first word line.

18. The device according to claim 6, wherein:

the second switch transistor is a MOS transistor, wherein:

a drain electrode of the MOS transistor is connected to the second side of the magnetic tunnel junction;

a source electrode of the MOS transistor is connected to the source line; and a gate electrode of the MOS transistor is connected to the second word line.

\* \* \* \* \*